US006392808B1

(12) United States Patent
Te Kolste et al.

(10) Patent No.: US 6,392,808 B1
(45) Date of Patent: May 21, 2002

(54) BROAD BAND CONTROLLED ANGLE ANALOG DIFFUSER AND ASSOCIATED METHODS

(75) Inventors: Robert D. Te Kolste; Alan D. Kathman; Michael R. Feldman, all of Charlotte, NC (US)

(73) Assignee: Digital Optics Corporation, Charlotte, NC (US)

( * ) Notice: Subject to any disclaimer, the term of this patent is extended or adjusted under 35 U.S.C. 154(b) by 0 days.

(21) Appl. No.: 09/240,611

(22) Filed: Feb. 1, 1999

Related U.S. Application Data (63) Continuation-in-part of application No. 09/160,322, filed on Sep. 25, 1998, now Pat. No. 6,025,938, which is a continuation of application No. 08/770,524, filed on Dec. 20, 1996, now Pat. No. 5,850,300, which is a continuation-in-part of application No. 08/203,188, filed on Feb. 28, 1994, now Pat. No. 5,610,733.

(51) Int. Cl.[7] .................................................. G02B 5/02
(52) U.S. Cl. .............................. 359/599; 359/9; 359/15
(58) Field of Search .............................. 359/9, 15, 599, 359/575

(56) References Cited

U.S. PATENT DOCUMENTS

| 4,170,396 A | | 10/1979 | Kraft ........................... 359/15 |
| 4,410,237 A | | 10/1983 | Veldkamp .................... 359/569 |
| 4,427,265 A | * | 1/1984 | Suzuki et al. ................ 359/599 |
| 4,455,061 A | | 6/1984 | Case ............................. 359/15 |
| 4,547,037 A | | 10/1985 | Case ............................. 359/15 |
| 4,682,841 A | | 7/1987 | Afian et al. .................... 359/15 |
| 4,979,791 A | | 12/1990 | Bowen et al. ................. 385/33 |
| 5,061,025 A | | 10/1991 | Debesis ....................... 359/569 |
| 5,075,800 A | | 12/1991 | Hasman et al. ............... 359/15 |
| 5,093,749 A | * | 3/1992 | Maeda ........................ 359/575 |
| 5,117,476 A | | 5/1992 | Yingst et al. ................... 385/88 |
| 5,202,775 A | | 4/1993 | Feldman et al. ................ 359/9 |
| 5,289,298 A | | 2/1994 | Smith ........................... 359/14 |
| 5,315,427 A | | 5/1994 | Rauch et al. ................. 354/569 |
| 5,361,149 A | | 11/1994 | Hasegawa et al. .............. 359/9 |
| 5,383,000 A | | 1/1995 | Michaloski ................... 355/67 |
| 5,393,634 A | * | 2/1995 | Maker et al. ................ 359/569 |
| 5,482,800 A | * | 1/1996 | Gal ............................. 359/569 |
| 5,534,386 A | | 7/1996 | Peterson et al. ............... 359/15 |
| 5,566,023 A | * | 10/1996 | Kley ........................... 359/569 |
| 5,610,733 A | | 3/1997 | Feldman et al. ................ 359/9 |
| 5,630,661 A | | 5/1997 | Fox ............................. 362/187 |
| 5,631,721 A | | 5/1997 | Stanton et al. ............... 359/569 |
| 5,754,342 A | * | 5/1998 | Ohnishi et al. .............. 359/569 |
| 5,861,990 A | * | 1/1999 | Tedesco ...................... 359/599 |
| 6,002,520 A | * | 12/1999 | Hoch et al. .................. 359/599 |

FOREIGN PATENT DOCUMENTS

EP 0744644 A2 11/1996
FR 2 716 726 9/1995

OTHER PUBLICATIONS

Ralf Bräuer, et al., "Diffusers in digital holography", J. Opitcal Soc. America A Vol. 8, No. 3, pp. 572–578, Mar. 1991.*

Yoshikazu Nakayama, et al., "Diffuser with pseudorandom phase sequence", J. Optical Soc. America, vol. 69, No. 10, pp. 1367–1372, Oct. 1979.*

(List continued on next page.)

*Primary Examiner*—Cassandra Spyrou
*Assistant Examiner*—John Juba, Jr.
(74) *Attorney, Agent, or Firm*—Susan S. Morse (57) ABSTRACT

An analog controlled angle diffuser and associated methods provide a wavelength insensitive diffuser with a controlled output. The diffuser has free formed shaped analog fringes, i.e., fringes which have a continuous cross-section from their peak to their termination. Preferably, the depth of the analog fringes will be at least $2\pi$, even more preferably at least $20\pi$. Advantageously, the pattern of the diffuser is computer-generated.

15 Claims, 4 Drawing Sheets

OTHER PUBLICATIONS

Wai–Hon Lee, "Method for Converting a Gaussian Laser Beam into a Uniform Beam", Optics Comm., vol. 36, No. 6, pp. 469–471, Mar. 15, 1981.*

M. T. Eisman et al., "Iterative Design of a Holographic Beamformer"; Applied Optics; vol. 28; No. 13: pp 2641–2650; Jul. 1989.

Sunny Bains, "Holographic Optics: When Less is More", Laser Focus World, pp. 151–156, Apr. 1993.

J. Cederquist, et al., "Computer–Generated Holograms for Geometric Transformations", Applied Optics, vol. 23, No. 18, pp 3099–3104.

Y. H. Wu, et al., "Cell–Oriented On–Axis Computer–Generated Holograms for use in the Fresnel Diffraction Mode", Applied Optics, vol. 23, No. 2.

M.A. Golub, et al., "Focusing Light into a Specified Volume by Computer–Synthesized Holograms", Sov. Tech. Phys. Lett., 7(5).

M. R. Feldman, et al., "Iterative Encoding of High–Efficiency Holograms for Generation of Spot Arrays", Optics Letters, vol. 14, No. 10, pp. 479–481.

* cited by examiner

BROAD BAND CONTROLLED ANGLE ANALOG DIFFUSER AND ASSOCIATED METHODS

CROSS-REFERENCE TO RELATED APPLICATIONS

The present application claims CIP under 35 U.S.C. §120 to U.S. Pat. No. 6,025,938, filed as U.S. application Ser. No. 09/160,322 filed on Sep. 25, 1998, the entire contents of which are hereby incorporated by reference for all purposes, which is a continuation of U.S. Pat. No. 5,850,300 filed as U.S. application Ser. No. 08/770,524 on Dec. 20, 1994, which is a continuation-in- part of U.S. Pat. No. 5,610,733, filed as U.S. application Ser. No. 08/203,188 on Feb. 28, 1994 both of which are hereby incorporated by reference for all purposes.

BACKGROUND OF THE INVENTION

1. Field of the Invention

The present invention is directed to a broad band controlled angle analog diffuser and associated methods. In particular, the present invention is directed to a diffuser which has the benefits of the wavelength independence of a refractive element and the design control of a diffractive element.

2. Description of Related Art

A binary or diffractive diffuser functions well as its design wavelength, but suffers significant contributions from the zero-order as the wavelength deviates from the design wavelength. The zero-order contributions arise from that light which is not diffracted. This will lead to undesirable peaks in intensity when the design wavelength is deviated from.

An attempt to compensate for this high sensitivity to wavelength variations is disclosed in commonly assigned, co-pending U.S. application Ser. No. 09/071,762 entitled "Broad Band Diffractive Diffuser" filed on May 5, 1998, the entire contents of which are hereby incorporated by reference. While such a diffuser allows some variation from the design wavelength, e.g., ±20%, the diffuser is still not wavelength independent. Further, while the broad band diffractive diffuser reduces zero order contributions at wavelengths other than the design wavelength, the divergence angles of the different wavelengths vary.

The wavelength dependence is inherent in the diffractive structure having etch depths related to the design wavelength $\lambda_0$, typically a $\lambda_0/2(n-1)$ etch depth for narrow band diffractive diffusers and typically a $\lambda_0/(n-1)$ etch depth for the broad band diffractive diffuser, where n is the refractive index of the material in which the structure is formed. However, diffractive diffusers have an advantage in that they allow the angle into which an incoming beam is diffused to be very precisely controlled.

In contrast, conventional refractive diffusers, such as a fly's eye lens array, are relatively wavelength insensitive. However, the angular distribution over which these refractive diffusers radiate cannot be accurately controlled. For many applications, it is desirable to control this angular distribution. Typically when using refractive diffusers, this control is partially provided by the shape of the individual lenses or by an aperture to block angles other than the desired angles. The use of apertures results in an undesired loss in power. Creating lenses that are not spherical is typically very expensive, restricting the practical application of control of the angular distribution using the shape of the lenses. Finally, the use of two elements requires more space, which is often a significant constraint for the overall system in which the diffuser is incorporated.

SUMMARY OF THE INVENTION

The present invention is therefore directed to a broad band diffuser and method which substantially overcomes one or more of the problems due to the limitations and disadvantages of the related art.

These and other objects may be realized by providing an analog diffusing system for converting an input beam into an output beam having a preselected spatial energy distribution at an output plane including a computer generated structure having a plurality of regions, each region including free form shaped analog fringes, the input beam illuminating at least some of the regions, each region deflecting a majority of the portion of the input beam incident thereupon, so that at a target located at the output plane, the portion of the input beam deflected by several of the illuminated regions overlaps the portion deflected by at least one other illuminated region at the target to form the output beam. Preferably, the depth of a majority of the analog fringes is at least $2\pi$ for wavelengths of interest.

These and other objects of the present invention may also be realized by an analog system for converting an incident beam into an output beam at an output plane spaced from the system, including a computer generated structure having a plurality of regions, each region having free form shaped analog fringes such that portions of the incident beam deflected by at least two regions of the plurality of regions overlap at the output plane, whereby the output beam has a preselected spatial energy distribution that is relatively insensitive to fluctuations in positioning of an input beam for incidence on the system, to spatial energy distributions within the incident beam, and to wavelengths of the incident beam.

The free form shaped analog fringes form a pattern which may be substantially discontinuous or substantially continuous at edges of the regions. The output beam may have a relatively uniform spatial energy magnitude and a preselected transverse beam shape. The depth of a majority of the analog fringes is preferably at least $2\pi$ for wavelengths of interest.

These and other objects of the present invention may further be realized by an optical system including an analog diffusing element formed by a plurality of regions having a pattern thereon, the pattern being formed by smooth, free form shaped analog features, wherein each of the plurality of regions, when illuminated by a same input beam, transmits a beam with a predetermined angular spread, so that a given angular spread is imparted to the input beam, wherein the output beam is relatively insensitive to spatial energy distributions within the incident beam, and to wavelengths of the incident beam. Preferably, a majority of the analog features have a depth of at least $2\pi$ for the wavelengths of interest These and other objects of the present invention may also be realized by an analog optical element including a computer generated structure having a plurality of analog fringes, the analog fringes providing a statistical distribution of slopes in accordance with a desired output beam.

A majority of the analog fringes preferably have a depth of at least $2\pi$ for wavelengths of interest, even more preferably, a depth of at least $20\pi$ for wavelengths of interest. The desired output beam may have an angular distribution which is invariant across the output beam or which varies across the output beam. The cross-sections of the analog fringes may be curved, pyramidal, or sinusoidal. The fringes may be waves with a varying periodicity along perpendicular axes. The fringes may be formed in photoresist, which then may be transferred into a transparent substrate. The fringes may be formed on both sides of the element. The heights of the fringes may be the same, while the slope of the fringes is varied by altering a width of fringes. An intensity of light output by the analog optical element is preferably directly proportional to a surface area at a tangent normal for incident light.

These and other objects of the present invention may further be realized by a method of forming an analog optical element including forming analog fringes of a computer generated structure in an optically transparent material, the analog fringes having a statistical distribution of slopes in accordance with a desired output beam. The forming may include forming a majority of the analog fringes with a depth of at least $2\pi$ for wavelengths of interest. Heights of the fringes may be varied to form the distribution of slopes. Widths of the fringes may be varied to form the distribution of slopes. The fringes may be formed in photoresist, and then may be further transferred into a transparent substrate. The forming may include creating a mask, placing the mask a distance from a photosensitive layer, exposing the photosensitive layer through the mask, and developing the exposed layer to create the fringes. The forming may include creating a gray mask, placing the mask on a photosensitive layer, exposing the photosensitive layer through the mask, and developing the exposed layer to create the fringes. The forming may include forming features on both sides of a substrate. The forming may include varying the statistical distribution of slopes across the optically transparent material. The forming may include maintaining the statistical distribution of slopes across the optically transparent material.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The foregoing and other objects, aspects and advantages will be described with reference to the drawings, in which.

DETAILED DESCRIPTION OF PREFERRED EMBODIMENTS

While the present invention is described herein with reference to illustrative embodiments for particular applications, it should be understood that the present invention is not limited thereto. Those having ordinary skill in the art and access to the teachings provided herein will recognize additional modifications, applications, and embodiments within the scope thereof and additional fields in which the invention would be of significant utility without undue experimentation.

As noted above, purely diffractive diffusers are typically made with etch depths of $\lambda_0/2(n-1)$. At the design wavelength $\lambda_0$, the portions with an etch depth of $\lambda_0/2(n-1)$ present a phase shift of $\pi$ to the incoming light. Thus, the zero order contributions from the unetched zero regions and the etched $\pi$ regions cancel each other, thereby resulting in no zero order contribution. For any other wavelength, the zero order contribution from the unetched zero regions will be the same as that for the design wavelength. However, for an input wavelength other than the design wavelength, or integer multiples of the corresponding wavenumber thereof, the portions etched to the depth of $\lambda_0/2(n-1)$, this depth will no longer look like a phase shift of $\pi$ to the input wavelength. Thus, the zero order contribution from the etched regions will no longer cancel the zero order contribution from the unetched regions. If the input wavelength is less than the design wavelength, the phase shift will appear greater than $\pi$. When the input wavelength is greater than the design wavelength, the phase shift will appear less than $\pi$.

Under either circumstance, there will be a zero order contribution for wavelengths other than the design wavelength. This zero order contribution reduces the efficiency of the purely diffractive diffuser at wavelengths other than the design wavelength. For example, in the range of $\lambda=0.83 \lambda_0$ to $\lambda=1.20 \lambda_0$, the zero order diffraction efficiency will be as high as 10%, i.e., 10% of the input beam will be delivered to the zero order, reducing the efficiency and severely impacting general usefulness of the conventional diffractive diffuser.

While the introduction of an additional $\lambda_0/(n-1)$ etch depth as disclosed in the above referenced co-pending application, the range of wavelengths around the design wavelength for which the zero order contribution can be minimized to an acceptable level can be extended. However, the divergence angle is still wavelength dependent and, outside this range, the efficiency is still wavelength dependent. Additionally, as wavelengths for which diffusers are desired get shorter, the etch depth equal to a $2\pi$ phase shift gets shorter. Thus, the diffractive diffuser, which typically requires etching within $\pm 3\%$ $\lambda$ of the design depth, gets more difficult.

Therefore in accordance with the present invention, a controlled angle diffuser which is more refractive so it is wavelength insensitive is to be created. Typically, pure diffractive elements are etched to a depth of less than on the order of $\lambda_0/(n-1)$, i.e., presenting a phase shift of less than $2\pi$ for the design wavelength. While pure refractives are not typically characterized as having individual features, i.e., phase resets, elements having features on the order of $100\lambda/(n-1)$ are purely refractive. Thus, diffractives are made more refractive by having deeper structures, with smoother surface variations. In accordance with the present invention, the control of the diverging angles provided by the analog diffuser is realized by controlling the slope or pitch of the smooth variation portions of the structures. The different slopes represent different radii of curvature, and thus different focal lengths, which in turn provide different distributions. The shorter the focal length, the larger the spread or diverging angle. The deeper the resulting structure and more smoothly varying the surface, the more refractive the resulting diffuser appears. However, the deeper structure will require more space for the same slope, reducing the statistical spread available for controlling the diverging angle. Thus, the design is a trade-off between control of the diverging angle and wavelength independence.

The characteristics of a purely digital diffractive diffuser, an analog diffractive diffuser and a controlled angle refractive diffuser are summarized below in Table 1, in which $I_T$ is the total transmitted intensity, a is the surface area tangent normal, b is the surface area, $\sigma$ is the phase variance due to the surface, and $\theta_0$ is the divergence angle at the design wavelength. The behavior of the analog diffuser of the present invention will be predominately represented by the analog diffractive diffuser when the features have a continuous cross-section and an etch depth of up to $2\pi$. The behavior of the analog diffuser of the present invention will be predominately represented by the controlled angle refractive diffuser when the features have a continuous cross-section and an etch depth of at least $20\pi$. The behavior of an analog diffuser of the present invention having an etch depth between $2\pi$ and $20\pi$ will have components of both diffuser types.

U.S. application Ser. No. 09/044,864, which is hereby incorporated by reference in its entirety. While the methods used are the same as in this application, the masks used in the methods are different than those used in the previous application. Alternatively, lines of photoresist may be provided on a substrate and then reflowed.

The patterns used to create the controlled angle analog diffusers may be formed using a computer to generate a pattern of line widths, which correspond to spatial frequencies, chosen in accordance with the desired diffusion. The footprint of this diffuser may be kept the same, while the height and/or width of the line widths may be varied. Each line width forms a lens with a particular radius of curvature. The radius of curvature means the focal length is also changed, which results in a different intensity distribution. The shorter the focal length, the larger the divergence spread.

The pattern for creating the analog diffuser of the present invention is formed using a computer to create features having a statistical distribution of slopes. Each angle of the desired angular distribution corresponds to a different pitch or slope. The desired angular distribution will also dictate a

TABLE 1

| Parameter | Digital Diffractive Diffuser | Analog Diffractive Diffuser | Controlled Angle Refractive Diffuser |
|---|---|---|---|
| zero order | $I_0 = I_T \sin^2(\pi\lambda_0/2\lambda)$ | $I_0 = I_T e^{-2\pi\sigma\lambda_0/\lambda}$ | $I_0 = I_T a^2/b^2$ |
| divergence | $\theta(\lambda) = \sin^{-1}[(\lambda/\lambda_0)\sin\theta_0]$ | $\theta(\lambda) = \sin^{-1}[(\lambda/\lambda_0)\sin\theta_0]$ | $\theta(\lambda) = \theta_0 \dfrac{n(\lambda) - 1}{n(\lambda_0) - 1}$ |

One way to create features with varying slopes is to spin a thick, e.g., greater than 1–2 μm, layer of photoresist onto a glass wafer and create a wavy variation in surface height in the photoresist by exposing it with spatially varying intensities of magnitude less than that required to clear the resist upon developing but great enough maximum magnitude to cause the photoresist height to modulate. The pattern in the photoresist may then be transferred to the glass wafer in a conventional manner.

Creating such an intensity pattern in photoresist can be done in a number of ways. One way is to take a computer-generated random binary pattern having a statistical distribution of the desired spatial frequencies on a mask and proximity print the pattern, i.e., place the pattern out of focus relative to the photoresist and use as an exposure mask. The amount of defocus depends on the desired intensity pattern of the illumination light at the photoresist plane. An example of this method is shown by the cross-sections in FIGS. 1A–1C.

Figure 1A:
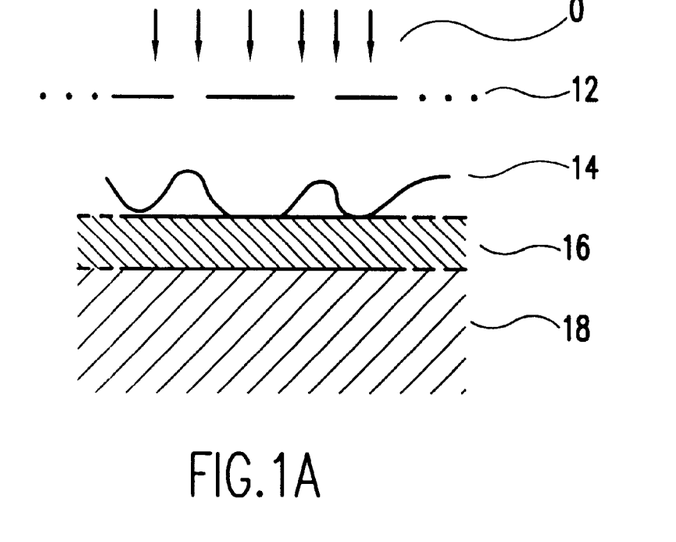
FIGS. 1A–1C is a cross-section view of a method of making an optical element in accordance with the present invention.

As shown in FIG. 1A, exposure light 10 uniformly illuminates a pattern 12 which is spaced apart from a photoresist layer 16 on a substrate 18. The intensity of the light at the plane of the photoresist layer 16 in indicated at 14.

Figure 1B:
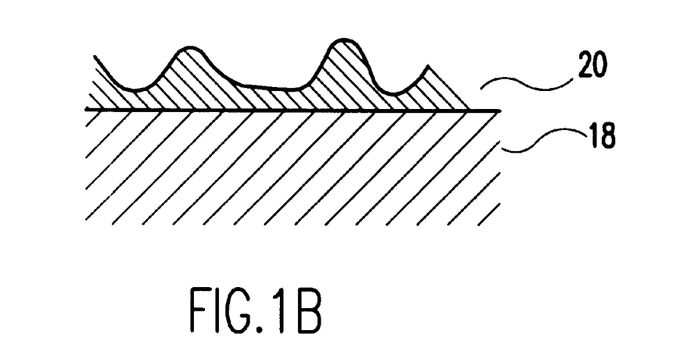
Figure 1C:
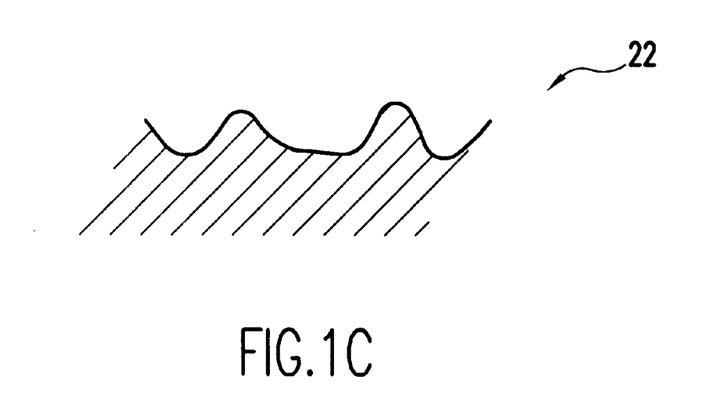

As shown in FIG. 1B, after the photoresist layer has been developed, the developed photoresist layer 20 on the substrate 18 has a modulated height pattern therein. This pattern in the developed photoresist layer 20 may then be transferred into the substrate 18 as shown in FIG. 1C, to form the controlled angle diffuser 22.

Another method is to use a gray scale mask to expose the photoresist. Both of the gray scale and the proximity printing methods are disclosed in commonly assigned, co-pending certain amount of power to be deflected into each angle. Thus, the desired angular distribution determines the slopes of the features and the statistical distribution of these slopes among the features. For example, if a desired angular distribution requires angles of ±10° having uniform power, than there would be an equal number of features having the corresponding slopes for each angle in this angular spread. If, for example, more power was desired at ±7°, proportionally more features would be provided having the slope corresponding to ±7° in accordance with the power differential desired.

Often, the analog diffuser will be designed such that over any arbitrarily selected region of sufficient size, i.e., containing enough features to be statistically significant sampling of the distribution of slopes, typically on the order of roughly twenty times the period of the highest spatial frequency, light incident thereon will be deflected into the desired angular distribution. If the desired angular spread is to be different depending upon the position on which the light is incident on the analog diffuser, then regions of sufficient size may be provided which result in different angular distributions across the analog diffuser.

Figure 2A:
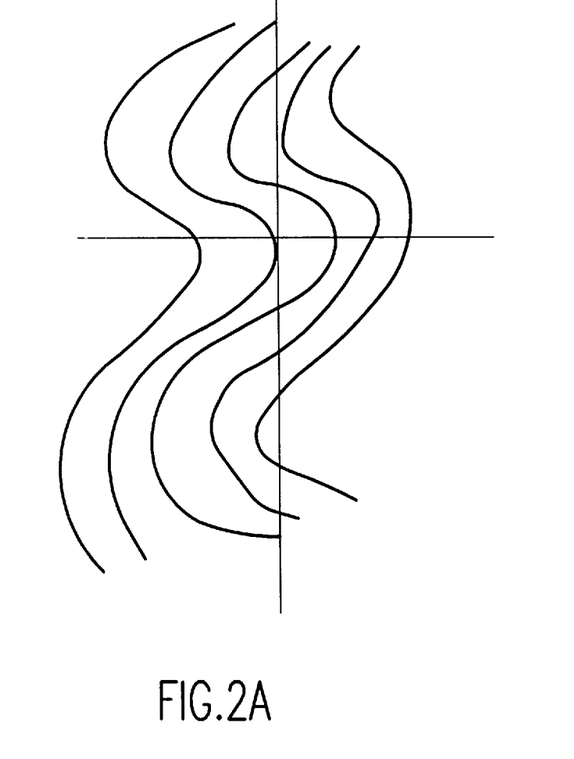
FIG. 2A is a top view of a noodle pattern forming the analog optical element of the present invention.

An example of a particular design which allows the angular distribution to be controlled while providing a more wavelength insensitive diffuser is shown in FIG. 2A. FIG. 2A is a top view of a noodle pattern which has a varying pitch T, where T is the distance between peaks. T is preferably greater than between ten and twenty times a wavelength of interest, i.e., all wavelengths at which the diffuser is intended to be used, and the depth is preferably greater than five times a wavelength of interest. The pitch T varies in both directions.

Figure 2B:
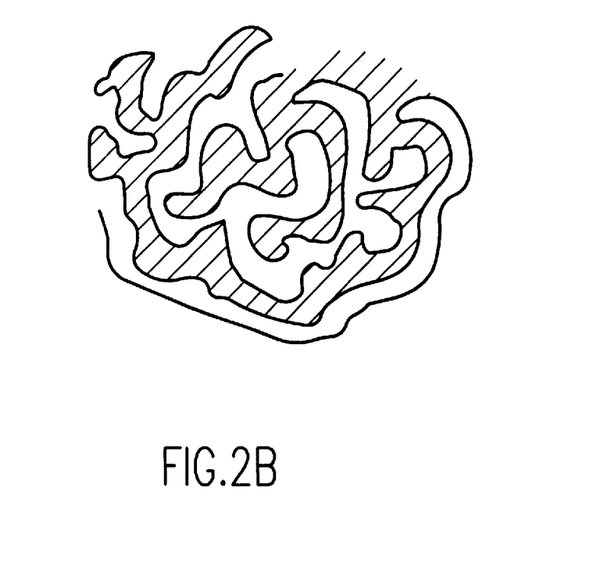
FIG. 2B is a top view of another pattern for forming the analog optical element of the present invention.

Another example of a design of the controlled angle analog diffuser is shown in FIG. 2B, in which a diffuser pattern is generated by varying line widths as disclosed in commonly assigned, co-pending application Ser. No. 08/770,524 filed Dec. 20, 1996, which is hereby incorporated by reference in its entirety. The hatched portions are the blocking portions. As can be seen from the top view, the diffuser pattern has a plurality of fringes which are free-form in shape. In addition to the top view of this pattern and in accordance with the present invention, the heights of the features are varied periodically to provide the refractive component of the diffuser. Further in accordance with the present invention, the depth of at least a majority of the analog fringes is preferably at least $2\pi$ for the wavelengths of interest.

These analog fringes deflect the input beam to a target to an output beam having a preselected spatial energy distribution. The overall analog diffuser is a computer generated structure which has a plurality of regions including these free-form shaped fringes or features. Each point in a region of the analog diffuser deflects the input beam over substantially all of the target for that region. The regions may be formed so that the analog fringes contained in adjacent regions are substantially continuous across the regions, or may be discontinuous across the regions. The analog fringes will be discontinuous across adjacent regions when, for example, the analog diffuser is formed by creating a region having a desired angular distribution and then creating an array of these regions or the analog diffuser is formed by creating a plurality of regions having different angular distributions such that the angular distribution of the output beam is dependent upon the location of the input beam on the analog diffuser.

While the element shown in FIG. 2B may serve as an actual diffractive diffuser of the above-mentioned application, this element can also serve as a mask for forming the analog diffuser of the present invention in conjunction with the above noted methods. In contrast to the diffractive diffuser, the analog diffuser of the present invention has fringes with cross-sections which are continuous from their peak to their termination, i.e., analog fringes. Examples of the cross-sections of the analog fringes are shown in FIGS. 3A–3E. In the diffractive diffuser, the fringes will have cross-sections which have discrete levels of constant phase.

Figure 3A:
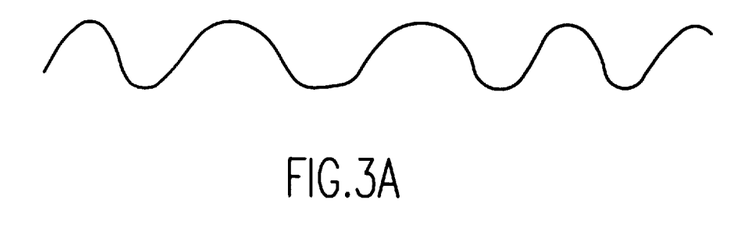
FIGS. 3A–3E are different profiles of the noodle pattern, depending on the method used to create the noodle pattern.

Depending on the manner in which the noodle pattern is created, various cross-sections of these noodles will be realized. For sinusoidal features created using a gray mask or contact printing, as shown in FIG. 3A, a change in the pitch results in a change in the radius of curvature, and thus the focal length. The sagittal height is constant. By providing these different focal lengths, the output at selected angles can be emphasized. The periodicity provides a diffractive effect which allows the diverging angle to be controlled. If the periodic, sinusoidal structure was etched to the depth of a wavelength or less, it would act like a diffractive. By etching very deep, e.g., at least an order of magnitude greater than a wavelength of the longest wavelength of interest for at least a majority of the features, the structure will act primarily like a refractive for the wavelengths of interest.

Figure 3B:
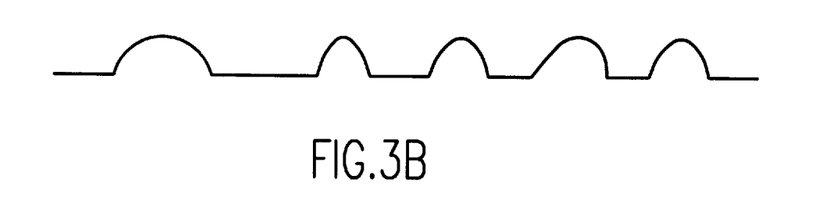
Figure 3C:
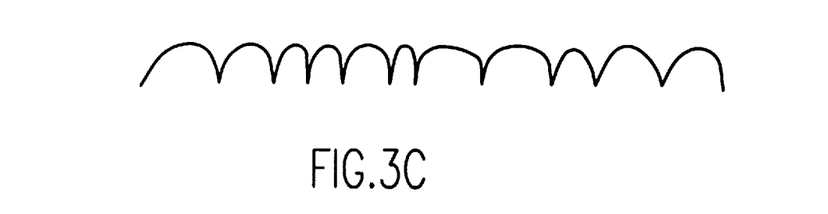

Other structures providing varying slopes may be formed be providing photoresist on a substrate at varying widths and reflowing the photoresist. Such creation will result in structures shown in FIGS. 3B and 3C. Where the features are spaced, as shown in FIG. 3B, a lot of light will go straight through the element, and thus not be directed into the desired diverging angles. Even if the spacing is tightly controlled as shown in FIG. 3C, the structure will still have some dead space. Further, the use of reflow does not allow the creation of negative or convex surfaces.

Figure 3D:
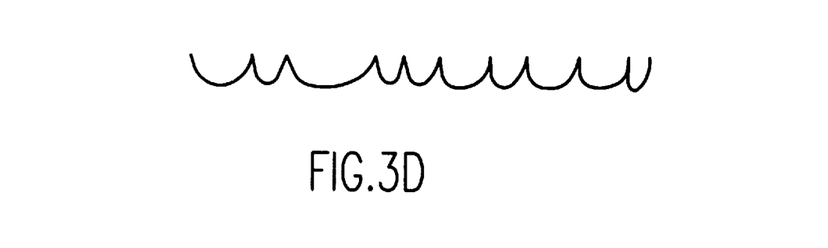

The use of negative or convex surfaces as is provided by the sinusoidal features allows the entire surface to be utilized, allows higher divergence angles to be realized and allows faster realization of the desired divergence angles. This is because the positive or convex surfaces focus the light before the light diverges. The gray scale mask techniques noted above may be used to provide an array of negative lenses as shown in FIG. 3D. However, the control of the period of the sinusoid is still the easiest mechanism for controlling the slope of the features.

Figure 3E:
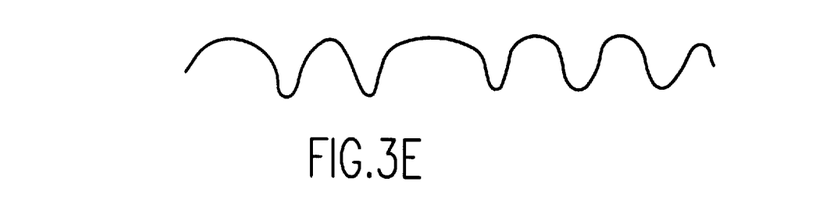

Finally, as shown in FIG. 3E, an approximate sinusoid may be realized by proximity printing, i.e., defocusing the mask. This approximate sinusoid does not have symmetric positive and negative surfaces, with the negative surfaces being smaller than the positive surfaces, but still allows the ease of control of changing the slope by changing the pitch without requiring the use of a gray mask, which tends to be more expensive than other masking techniques.

Figure 4:
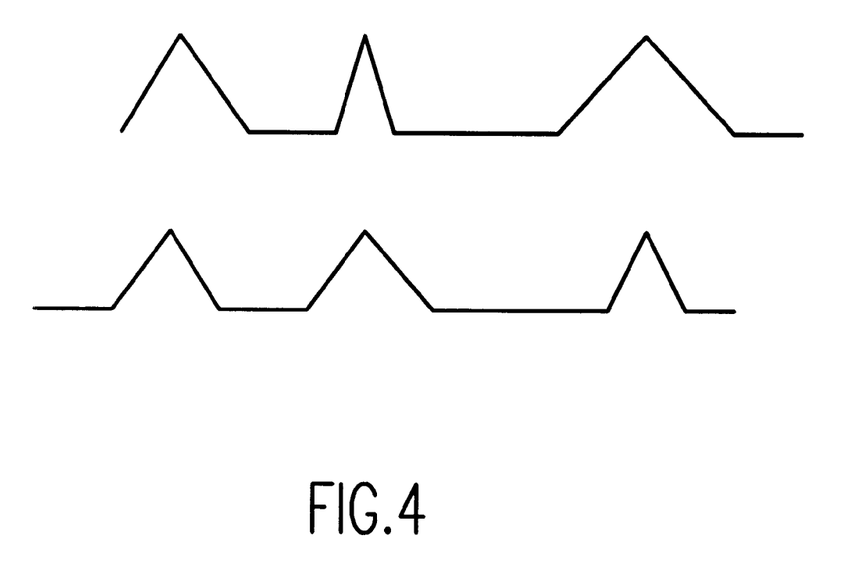
FIG. 4 is an elevational profile of angular features forming the analog optical element in accordance with the present invention.

Alternatively, the rounded features of the above embodiments may be replaced with an array of angular features, such as shown in FIG. 4 to create an analog element in accordance with the present invention. Again, the slopes of the features are varied to obtain the desired focal lengths by varying the widths of the features, while keeping the heights the same.

As described above, an analog optical element is provided with features of varying slope. The slope may be varied by varying the width of the features, while maintaining their heights, by changing the heights while keeping the widths constant, or some combination of altering these parameters. Further, all of the elements set forth herein may be formed in photoresist on a substrate, with the photoresist serving as the element itself, or the photoresist may be etched into the substrate in a conventional manner. Finally, the analog pattern may be provided on both sides of a substrate to increase the diverging angle.

Although preferred embodiments of the present invention have been described in detail herein above, it should be clearly understood that many variations and/or modifications of the basic inventive concepts taught herein, which may appear to those skilled in the art, will still falls within the spirit and scope of the present invention as defined in the appended claims and their equivalents.

What is claimed is:

1. An optical system comprising an analog diffusing element formed by a plurality of regions having a pattern thereon, said pattern being formed by smooth, free form shaped analog features:

the majority of the analog features having a phase depth of greater than $2\pi$ at a nominal design wavelength, whereby the efficiency of zero order light passed by the element is relatively insensitive to wavelength;

the analog features having respective slopes defined by their respective phase depths and feature widths, said slopes determining the angular spread of light deflected by said features;

the relative population of said analog features having a given slope determining the fraction of incident light deflected within a corresponding angular spread;

wherein each of said plurality of regions, when illuminated by a same input beam, transmits a beam with a predetermined angular spread, so that a given angular spread is imparted to the input beam, wherein the angular spread of the output beam is relatively insensitive to spatial energy distributions within the incident beam, and wherein, within each region, the analog features provide a non-random distribution of slopes statistically corresponding with the given angular spread.

2. The optical system of claim 1, wherein the majority of the analog features have a phase depth between $2\pi$ and $20\pi$.

3. The optical system of claim 1, wherein the analog features are of sufficient phase depth such that the angular spread is relatively insensitive to wavelength.

4. The optical system of claim 1, wherein the relative population of said analog features having a given slope is non-uniform across the angular spred.

5. The optical system of claim 1, wherein the analog features form a pattern which is substantially discontinuous at edges of the regions.

6. The optical system of claim 1, wherein the analog features form a pattern which is substantially continuous at edges of the regions.

7. The optical system of claim 1, wherein the majority of the analog features have a phase depth greater than $20\pi$.

8. The optical system of claim 1, wherein cross-sections of the analog features are curved.

9. The optical system of claim 1, wherein cross-sections of the analog features are pyramidal.

10. The optical system of claim 1, wherein cross-sections of the analog features are sinusoidal.

11. The optical system of claim 1, wherein the analog features are waves with a varying periodicity along perpendicular axes.

12. The optical system of claim 1, wherein the analog features are formed in photoresist.

13. The optical system of claim 12, wherein the analog features in photoresist are transferred into a transparent substrate.

14. The optical system of claim 1, wherein the analog features are on both sides of the analog diffusing element.

15. The optical system of claim 1, wherein depths of the analog features are equal and the slope of the features is varied by altering widths of the features.

* * * * *